US012713856B2

(12) United States Patent
Niizeki et al.

(10) Patent No.: US 12,713,856 B2
(45) Date of Patent: Aug. 18, 2026

(54) PLASMA PROCESSING METHOD AND PLASMA PROCESSING SYSTEM

(71) Applicant: Tokyo Electron Limited, Tokyo (JP)

(72) Inventors: Tomohiko Niizeki, Tokyo (JP); Maju Tomura, Miyagi (JP); Yoshihide Kihara, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 330 days.

(21) Appl. No.: 18/103,207

(22) Filed: Jan. 30, 2023

(65) Prior Publication Data

US 2023/0245898 A1 Aug. 3, 2023

(30) Foreign Application Priority Data

Jan. 31, 2022 (JP) ................................ 2022-013135

(51) Int. Cl.
*H10P 50/00* (2026.01)
*H10P 50/28* (2026.01)
*H10P 76/40* (2026.01)
*H01J 37/32* (2006.01)

(52) U.S. Cl.
CPC ............ *H10P 50/73* (2026.01); *H10P 50/287* (2026.01); *H10P 76/405* (2026.01); *H01J 37/32449* (2013.01); *H01J 2237/332* (2013.01); *H01J 2237/334* (2013.01)

(58) Field of Classification Search
None
See application file for complete search history.

(56) References Cited

U.S. PATENT DOCUMENTS

2007/0082483 A1* 4/2007 Bai .................. H01L 21/02063 257/E21.252
2017/0263611 A1 9/2017 Imamura et al.
2018/0226279 A1 8/2018 Ogawa et al.
2018/0337047 A1* 11/2018 Fung .................. H01L 21/0337
2021/0313192 A1* 10/2021 Joy .................. H01L 21/32139

FOREIGN PATENT DOCUMENTS

JP 2007-110112 A 4/2007
JP 2010109373 A 5/2010
JP 2017-163032 A 3/2017
JP 2017-045869 A 9/2017
KR 10-2007-0040633 A 4/2007
KR 10-2018-0043784 A 4/2018
WO WO-2021173154 A1 * 9/2021 ........ H01J 37/32091

* cited by examiner

*Primary Examiner* — Duy N Deo
*Assistant Examiner* — Andrew Keelan Laobak
(74) *Attorney, Agent, or Firm* — PROCOPIO. CORY, HARGREAVES & SAVITCH LLP

(57) ABSTRACT

Provided is a plasma processing method performed with a plasma processing apparatus including a chamber. The method includes: (a) providing a substrate in the chamber, the substrate having an organic film and a mask on the organic film, the mask including a silicon-containing film and a carbon-containing film on the silicon-containing film; and (b) forming a plasma from a processing gas in the chamber, the processing gas including an oxygen-containing gas and a gas containing Si or W and a halogen. (b) includes: (b1) forming a protective film on at least the carbon-containing film of the mask; and (b2) etching the organic film through the mask having the protective film formed thereon.

12 Claims, 8 Drawing Sheets

PLASMA PROCESSING METHOD AND PLASMA PROCESSING SYSTEM

CROSS-REFERENCE TO RELATED APPLICATIONS

The present application claims priority under 35 U.S.C. § 119 to Japanese Patent Application No. 2022-013135 filed on Jan. 31, 2022, the entire contents of which are incorporated herein by reference.

BACKGROUND

Exemplary embodiments of the present disclosure relate to plasma processing methods and plasma processing systems.

JP2010-109373A discloses a method for etching a silicon-containing film.

SUMMARY

In one exemplary embodiment of the present disclosure, a plasma processing method is provided, which is performed with a plasma processing apparatus including a chamber. The method includes (a) providing a substrate in the chamber, the substrate having an organic film and a mask on the organic film, the mask including a silicon-containing film and a carbon-containing film on the silicon-containing film; and (b) forming a plasma from a processing gas in the chamber, the processing gas including an oxygen-containing gas and a gas containing Si or W and a halogen, (b) including: (b1) forming a protective film on at least the carbon-containing film of the mask; and (b2) etching the organic film through the mask having the protective film formed thereon.

DETAILED DESCRIPTION

Figure 1:
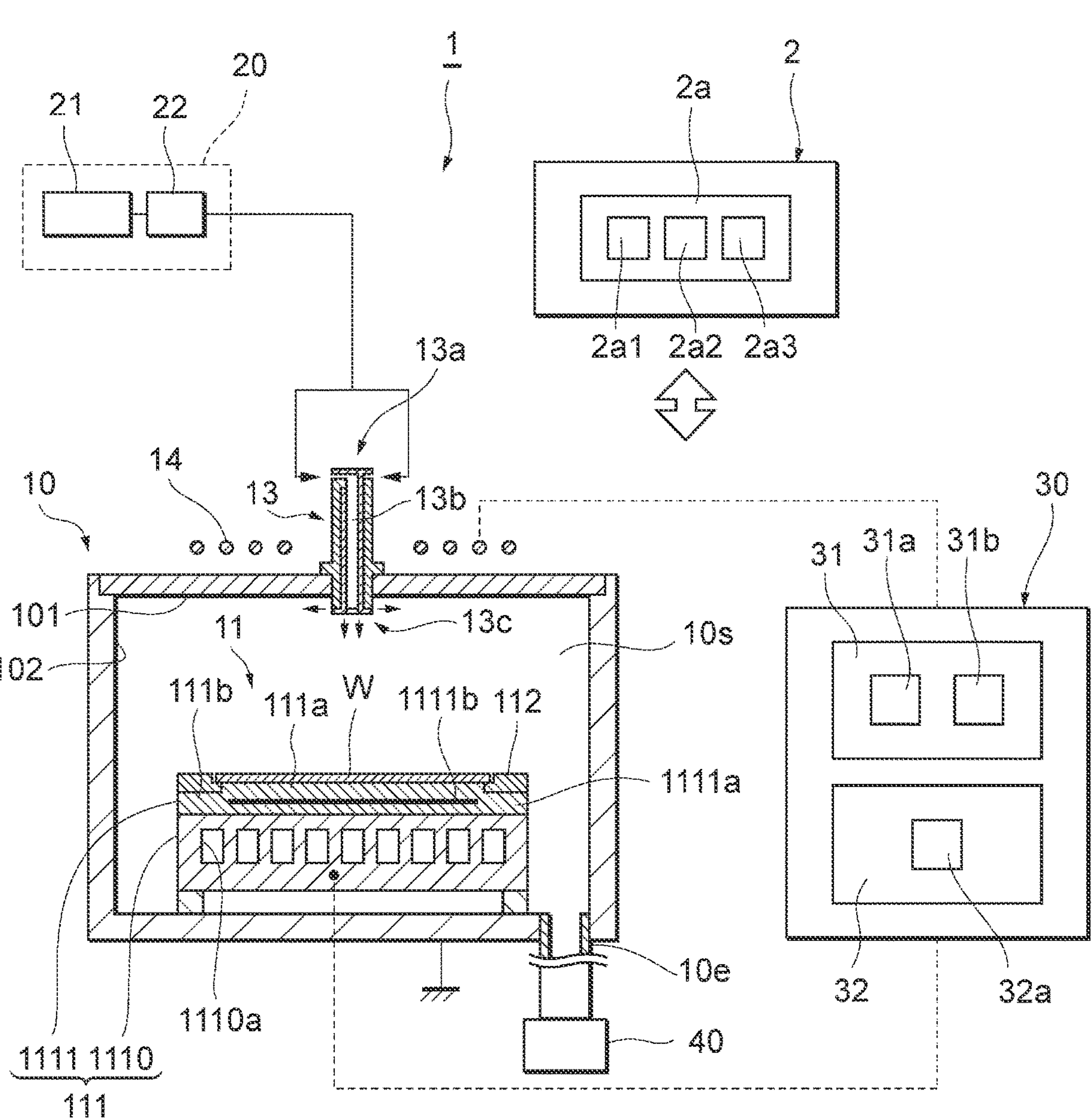
FIG. 1 schematically illustrates an exemplary plasma processing system.

The following describes embodiments of the present disclosure.

In one exemplary embodiment, a plasma processing method is provided, which is performed with a plasma processing apparatus including a chamber. The method includes: (a) providing a substrate in the chamber, the substrate having an organic film and a mask on the organic film, the mask including a silicon-containing film and a carbon-containing film on the silicon-containing film; and (b) forming a plasma from a processing gas in the chamber, the processing gas including an oxygen-containing gas and a gas containing Si or W and a halogen, (b) including: (b1) forming a protective film on at least the carbon-containing film of the mask; and (b2) etching the organic film through the mask having the protective film formed thereon.

In one exemplary embodiment, the gas containing Si or W and a halogen includes at least $SiCl_4$.

In one exemplary embodiment, the gas containing Si or W and a halogen includes at least $WF_6$.

In one exemplary embodiment, the protective film includes silicon or tungsten.

In one exemplary embodiment, the silicon-containing film includes a SiON film.

In one exemplary embodiment, the carbon-containing film includes a SOC film or a BARC film.

In one exemplary embodiment, the oxygen-containing gas includes at least one selected from the group consisting of $O_2$, $O_3$, CO, $CO_2$, and $H_2O$.

In one exemplary embodiment, the processing gas includes a sulfur-containing gas.

In one exemplary embodiment, the sulfur-containing gas includes COS or $SO_2$.

In one exemplary embodiment, the processing gas further includes a halogen-containing gas.

In one exemplary embodiment, a plasma processing method is provided, which is performed with a plasma processing apparatus including a chamber. The method includes: (a) providing a substrate in the chamber, the substrate having an organic film and a mask on the organic film, the mask including a carbon-containing film; and (b) forming a plasma from a processing gas in the chamber, the processing gas including an oxygen-containing gas and a gas containing Si or W and a halogen, (b) including: (b1) forming a protective film on at least the carbon-containing film of the mask; and (b2) etching the organic film through the mask having the protective film formed thereon.

In one exemplary embodiment, a plasma processing method is provided, which is performed with a plasma processing apparatus including a chamber. The method includes: (a) providing a substrate in the chamber, the substrate having an organic film and a mask on the organic film, the mask including a silicon-containing film and a carbon-containing film on the silicon-containing film; and (b) forming a plasma in the chamber by supplying a processing gas and etching the organic film through the mask, the processing gas containing an oxygen-containing gas and a gas containing Si or W and a halogen, the flow rate of the gas containing Si or W and a halogen to a total flow rate of the processing gas being less than 5 vol %.

In one exemplary embodiment, a plasma processing system is provided, including a chamber, a substrate support, a processing gas supply, and a controller. The controller being configured to cause (a) providing a substrate on the substrate support in the chamber, the substrate having an organic film and a mask on the organic film, the mask including a silicon-containing film and a carbon-containing film on the silicon-containing film; and (b) supplying a processing gas into the chamber by the processing gas supply to form a plasma, the processing gas including an oxygen-containing gas and a gas containing Si or W and a halogen, (b) including: (b1) forming a protective film on at least the carbon-containing film of the mask; and (b2) etching the organic film through the mask having the protective film formed thereon.

Configuration Example of Plasma Processing System

The following describes a configuration example of a plasma processing system. FIG. 1 schematically illustrates an exemplary plasma processing system.

The plasma processing system includes an inductively coupled plasma processing apparatus 1 and a controller 2. The inductively coupled plasma processing apparatus 1 includes a plasma processing chamber 10, a gas supply 20, a power source 30, and an exhaust system 40. The plasma processing chamber 10 includes a dielectric window. The plasma processing apparatus 1 also includes a substrate support 11, a gas inlet, and an antenna 14. The substrate support 11 is disposed in the plasma processing chamber 10. The antenna 14 is disposed on or above the plasma processing chamber 10 (i.e., on or above the dielectric window 101). The plasma processing chamber 10 has a plasma processing space 10*s* defined by the dielectric window 101, sidewalls 102 of the plasma processing chamber 10 and the substrate support 11. The plasma processing chamber 10 has at least one gas supply port for supplying at least one processing gas to the plasma processing space 10*s* and at least one gas exhaust port for exhausting gas from the plasma processing space. The plasma processing chamber 10 is grounded.

The substrate support 11 includes a main body 111 and a ring assembly 112. The main body 111 has a central region 111*a* for supporting a substrate W and an annular region 111*b* for supporting the ring assembly 112. A wafer is an example of the substrate W. The annular region 111*b* of the main body 111 surrounds the central region 111*a* of the main body 111 in plan view. The substrate W is disposed on the central region 111*a* of the main body 111, and the ring assembly 112 is disposed on the annular region 111*b* of the main body 111 so as to surround the substrate W on the central region 111*a* of the main body 111. Thus, the central region 111*a* is also referred to as a substrate support surface for supporting the substrate W, and the annular region 111*b* is also referred to as a ring support surface for supporting the ring assembly 112.

In one embodiment, the main body 111 includes a base 1110 and an electrostatic chuck 1111. The base 1110 includes an electrically conductive member. The electrically conductive member of the base 1110 can function as a bias electrode. The electrostatic chuck 1111 is disposed on the base 1110. The electrostatic chuck 1111 includes a ceramic member 1111*a* and an electrostatic electrode 1111*b* disposed in the ceramic member 1111*a*. The ceramic member 1111*a* has the central region 111*a*. In one embodiment, the ceramic member 1111*a* also has the annular region 111*b*. Note that another member surrounding the electrostatic chuck 1111, such as an annular electrostatic chuck or an annular insulating member, may have the annular region 111*b*. In this case, the ring assembly 112 may be disposed on the annular electrostatic chuck or the annular insulating member, or may be disposed on both the electrostatic chuck 1111 and the annular insulating member. At least one RF/DC electrode, which is coupled to a radio frequency (RF) power source 31 and/or a direct current (DC) power source 32 described below, may be disposed in the ceramic member 1111*a*. In this case, the at least one RF/DC electrode functions as a bias electrode. Note that the conductive member of the base 1110 and the at least one RF/DC electrode may function as a plurality of bias electrodes. Also, the electrostatic electrode 1111*b* may function as a bias electrode. Thus, the substrate support 11 includes at least one bias electrode.

The ring assembly 112 includes one or more annular members. In one embodiment, the one or more annular members include one or more edge rings and at least one cover ring. The edge ring(s) is made of a conductive material or an insulating material, and the cover ring(s) is made of an insulating material.

The substrate support 11 may include a temperature-controlled module configured to control at least one of the electrostatic chuck 1111, the ring assembly 112, and the substrate to a target temperature. The temperature-controlled module may include a heater, a heat transfer medium, a flow path 1110*a*, or a combination of them. A heat transfer fluid, such as brine or gas, flows through the flow path 1110*a*. In one embodiment, the channel 1110*a* is formed in the base 1110 and one or more heaters are disposed in the ceramic member 1111*a* of the electrostatic chuck 1111. The substrate support 11 may include a heat-transfer gas supply configured to supply a heat transfer gas to the gap between the rear face of the substrate W and the central region 111*a*.

The gas inlet is configured to introduce at least one processing gas from the gas supply 20 into the plasma processing space 10*s*. In one embodiment, the gas inlet includes a center gas injector (CGI) 13. The CGI 13 is disposed above the substrate support 11 and attached to a central opening formed in the dielectric window 101. The CGI 13 has at least one gas supply port 13*a*, at least one gas channel 13*b*, and at least one gas inlet port 13*c*. The processing gas supplied to the gas supply port 13*a* passes through the gas channel 13*b* and is introduced into the plasma processing space 10*s* from the gas inlet port 13*c*. In addition to or instead of the CGI 13, the gas inlet may include one or more side gas injectors (SGIs) attached to one or more openings formed in the side walls 102.

The gas supply 20 may include at least one gas source 21 and at least one flow rate controller 22. In one embodiment, the gas supply 20 is configured to supply at least one processing gas from a corresponding gas source 21 to the gas inlet via a corresponding flow rate controller 22. For instance, each flow rate controller 22 may include a mass flow controller or a pressure-controlled flow rate controller. The gas supply 20 may include one or more flow rate modulation devices that modulate or pulse the flow rate of the at least one processing gas.

The power source 30 includes the RF power source 31 that is coupled to the plasma processing chamber 10 via at least one impedance matching circuit. The RF power source 31 is configured to supply at least one RF signal (RF power) to the at least one bias electrode and the antenna 14. This forms a plasma from the at least one processing gas supplied to the plasma processing space 10*s*. Accordingly, the RF power source 31 may function as at least part of a plasma generator that is configured to form a plasma from one or more processing gases in the plasma processing chamber 10. A bias RF signal, which is supplied to the at least one bias electrode, generates a bias potential in the substrate W, so that ions in the formed plasma can be drawn toward the substrate W.

In one embodiment, the RF power source 31 includes a first RF generator 31*a* and a second RF generator 31*b*. The first RF generator 31*a* is coupled to the antenna 14 and configured to generate a source RF signal (source RF power) for plasma generation via at least one impedance matching circuit. In one embodiment, the source RF signal has a frequency within the range of 10 MHz to 150 MHz. In one embodiment, the first RF generator 31*a* may be configured to generate a plurality of source RF signals each having a different frequency. The generated one or more source RF signals are fed to the antenna 14.

The second RF generator 31*b* is coupled to the at least one bias electrode via at least one impedance matching circuit and is configured to generate a bias RF signal (bias RF power). The frequency of the bias RF signal may be the same as or different from the frequency of the source RF signal. In one embodiment, the bias RF signal has a frequency lower than the frequency of the source RF signal. In one embodiment, the bias RF signal has a frequency within the range of 100 kHz to 60 MHz. In one embodiment, the second RF generator 31*b* may be configured to generate a plurality of bias RF signals each having a different frequency. The generated one or more bias RF signals are fed to the at least one bias electrode. In various embodiments, at least one of the source RF signal and bias RF signal may be pulsed.

The power source 30 may also include a DC power source 32 coupled to the plasma processing chamber 10. The DC power source 32 includes a bias DC generator 32*a*. In one embodiment, the bias DC generator 32*a* is connected to the at least one bias electrode and configured to generate a bias DC signal. The generated bias DC signal is applied to the at least one bias electrode.

In various embodiments, the bias DC signal may be pulsed. In this case, a sequence of voltage pulses is applied to the at least one bias electrode. The voltage pulses may have rectangular, trapezoidal, triangular waveforms or waveforms in a combination of them. In one embodiment, a waveform generator to generate a sequence of voltage pulses from DC signals is connected between the bias DC generator 32*a* and the at least one bias electrode. Thus, the bias DC generator 32*a* and the waveform generator constitute a voltage pulse generator. The voltage pulses may have a positive polarity or a negative polarity. The sequence of voltage pulses may include one or more positive voltage pulses or one or more negative voltage pulses in one cycle. The bias DC generator 32*a* may be provided in addition to the RF power source 31, or may be provided instead of the second RF generator 31*b*.

The antenna 14 includes one or more coils. In one embodiment, the antenna 14 may include an outer coil and an inner coil that are coaxially arranged. In this case, the RF power source 31 may be connected to both the outer coil and the inner coil, or may be connected to either one of the outer coil and the inner coil. In the former case, the same RF generator may be connected to both the outer and inner coils, or separate RF generators may be connected to the outer and inner coils separately.

For instance, the exhaust system 40 may be connected to a gas exhaust port 10*e* provided at the bottom of the plasma processing chamber 10. The exhaust system 40 may include a pressure regulation valve and a vacuum pump. The pressure regulation valve regulates the pressure in the plasma processing space 10*s*. The vacuum pump may include a turbomolecular pump, a dry pump, or a combination of these.

The controller 2 processes computer-executable instructions that cause the plasma processing apparatus 1 to perform various steps described in this disclosure. The controller 2 can be configured to control each element of the plasma processing apparatus 1 to perform various steps described herein. In one embodiment, part or all of the controller 2 may be included in the plasma processing apparatus 1. The controller 2 may include a processor 2*a*1, a storage unit 2*a*2, and a communication interface 2*a*3. For instance, the controller 2 is implemented by a computer 2*a*. The processor 2*a*1 can be configured to read a program from the storage unit 2*a*2 and execute the read program to perform various control operations. This program may be stored in the storage unit 2*a*2 in advance, or may be acquired via a medium when necessary. The acquired program is stored in the storage unit 2*a*2, and the processor 2*a*1 reads the program from the storage unit 2*a*2 for execution. The medium may be various storage media readable by the computer 2*a*, or may be a communication line connected to the communication interface 2*a*3. The processor 2*a*1 may be a central processing unit (CPU). The storage unit 2*a*2 may include random access memory (RAM), read only memory (ROM), hard disk drive (HDD), solid state drive (SSD), or a combination of them. The communication interface 2*a*3 may communicate with the plasma processing apparatus 1 via a communication line such as a local area network (LAN).

Figure 2:
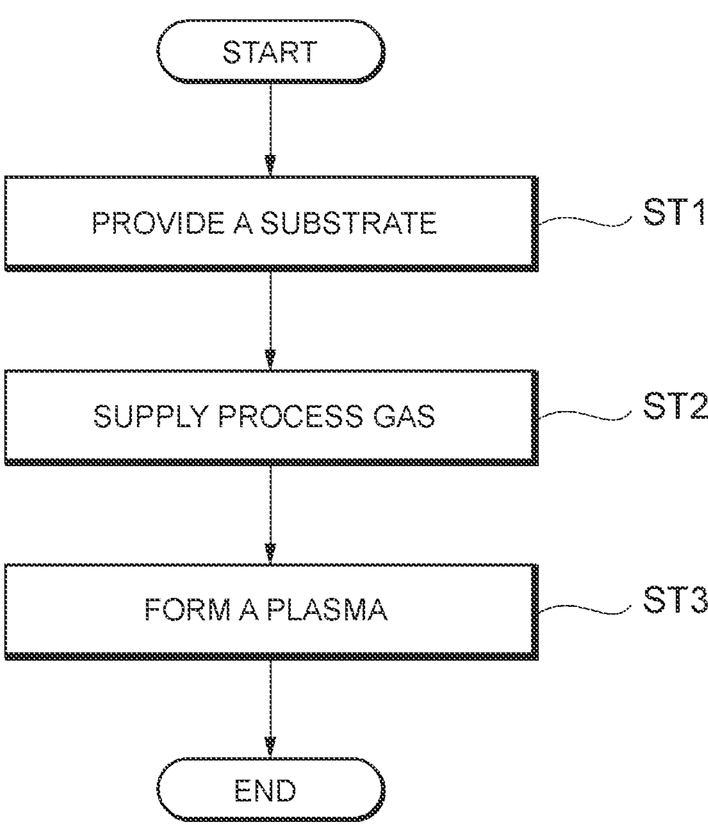
FIG. 2 is a flowchart showing the present processing method.

FIG. 2 is a flowchart showing a plasma processing method (hereinafter also referred to as "present processing method") according to one exemplary embodiment. The processing in each step may be performed by the plasma processing system illustrated in FIG. 1. The following describes the process by way of an example where the controller 2 controls each part of the plasma processing apparatus 1 to execute the present processing method on a substrate W. FIG. 2 includes a step ST1 of providing a substrate W, a step ST2 of supplying a processing gas, and a step ST3 of forming a plasma.

(Step ST1: Substrate Provision)

In step ST1, the substrate W is provided in the plasma processing space 10*s* of the plasma processing apparatus 1. The substrate W is provided on the top surface of the substrate support 11 and held on the substrate support 11 by the electrostatic chuck 1111.

Figure 3:
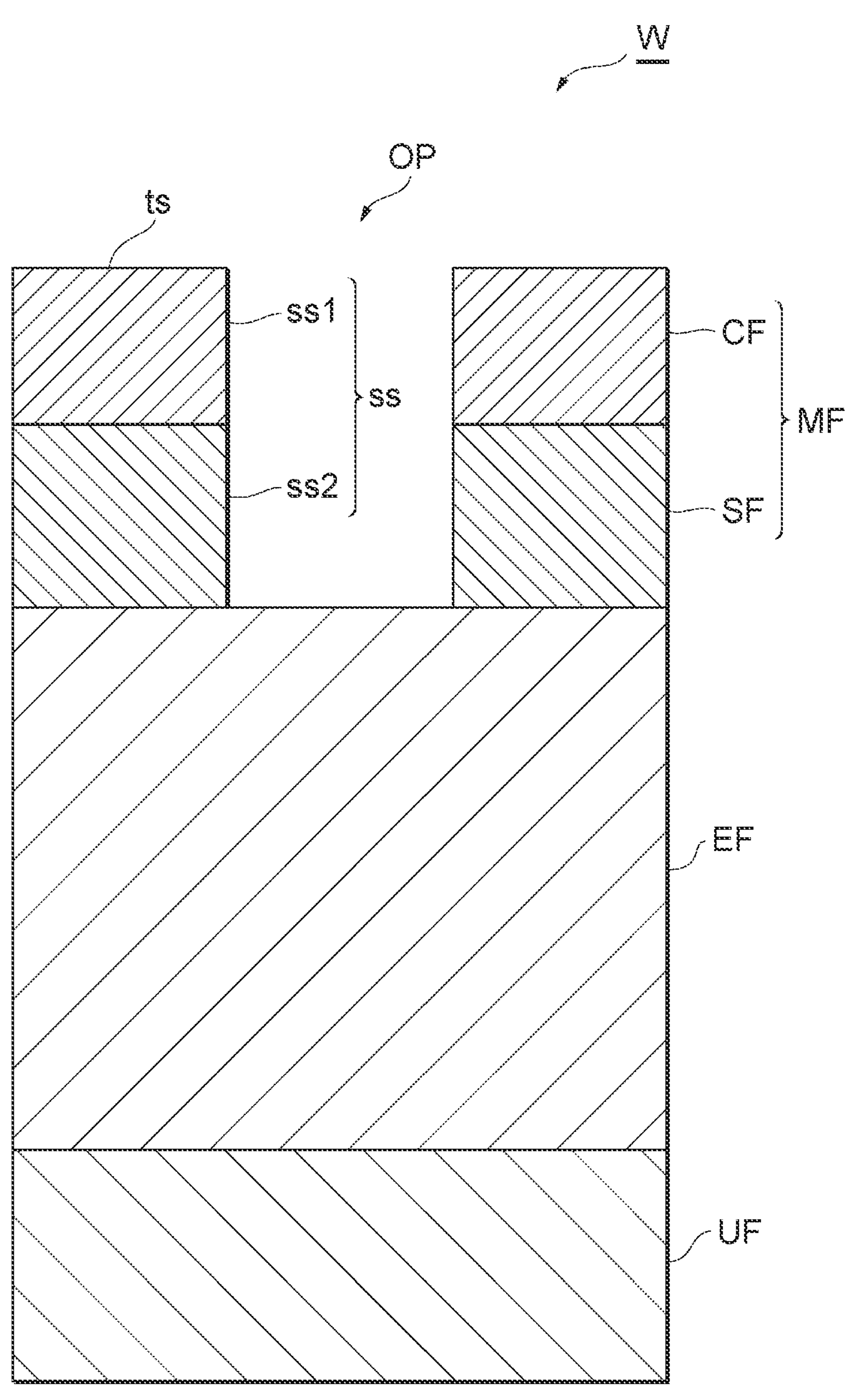
FIG. 3 schematically illustrates an example of the cross-sectional structure of a substrate W provided at step ST1.

FIG. 3 illustrates an example of the cross-sectional structure of a substrate W provided in step ST1. The substrate W has an etching target film EF and a mask MF that are stacked in this order on an underlying film UF. The mask MF may be formed of a plurality of layers, and for instance, it may be formed of two layers of a silicon-containing film SF and a carbon-containing film CF. The substrate W may be used in the manufacturing of semiconductor devices including semiconductor memory devices such as DRAM or 3D-NAND flash memory.

Examples of the underlying film UF include a silicon wafer or an organic film, dielectric film, metal film, or semiconductor film formed on a silicon wafer. The underlying film UF may include a stack of a plurality of films. For instance, the underlying film UF may be formed by alternately stacking a silicon oxide film and a polycrystalline silicon film or a silicon oxide film and a silicon nitride film.

The etching target film EF is an organic film, examples of which include a spin on carbon (SOC) film and an amorphous carbon layer (ACL) film.

The substrate W may further have another film under the underlying film UF, and the film stack of the etching target film EF and the underlying film UF may function as a multilayer mask. In other words, the film stack of the etching target film EF and the underlying film UF may be used as a multilayer mask to etch the other film.

The mask MF is formed on the top surface of the etching target film EF. In one exemplary embodiment, the mask MF may include two layers: a silicon-containing film SF and a carbon-containing film CF formed on the silicon-containing film. As will be described later, the mask MF may include a single layer of a carbon-containing film CF.

The silicon-containing film SF may be any film containing Si, such as silicon oxide film, silicon nitride film, silicon oxynitride film (SiON film), BSi film, WSi film, or silicon-anti reflection coating (Si-ARC) film.

The carbon-containing film CF may be any film containing carbon, such as SOC film, or bottom anti reflection coating (BARC) film.

As illustrated in FIG. 3, the mask MF has at least one opening OP. The opening OP is defined by side surfaces ss of the mask. The opening OP is a space on the etching target film EF surrounded by the side surfaces ss of the mask. That is, in FIG. 3, the top surface of the etching target film EF has a portion covered with the mask MF and a portion exposed through the opening OP. The opening OP may have any shape in plan view of the substrate W (when the substrate W is viewed from top to bottom in FIG. 3). For instance, the shape may be a circle, an ellipse, a rectangle, a line, or a shape combining one or more of these. The mask MF may have a plurality of openings OP. The plurality of openings OP may each have a hole shape and form an array pattern arranged at regular intervals. The plurality of openings OP may each have a linear shape and form a line and space pattern arranged at regular intervals. Each film (underlying film UF, etching target film EF, mask MF) including in the substrate W may be formed by various methods such as chemical vapor deposition (CVD), atomic layer deposition (ALD), and spin coating. Each of the above films may be a flat film, or may be a film having unevenness. The opening(s) OP in the mask MF may be formed by etching the mask MF.

At least part of the process of forming each film of the substrate W may be performed within the space of the plasma processing chamber 10. In one example, the step of etching the mask MF to form the opening(s) OP may be performed in the plasma processing chamber 10. That is, the etching of the opening(s) OP and of the etching target film EF, which will be described later, may be performed continuously in the same chamber. To provide the substrate W, after all or part of the films of the substrate W is formed in a device or chamber outside the plasma processing apparatus 1, the substrate W may be conveyed into the plasma processing space 10*s* and disposed on the top surface of the substrate support 11.

(Step ST2: Processing Gas Supply)

In process ST2, the gas supply 20 supplies processing gas to the plasma processing space 10*s*.

The processing gas includes oxygen-containing gas and gas containing Si or W and a halogen (hereinafter referred to as "Si/W gas"). The oxygen-containing gas includes at least one selected from the group consisting of $O_2$ gas, CO gas and $CO_2$ gas.

The Si/W gas may include at least one selected from the group consisting of $SiF_4$ gas, $SiCl_4$ gas, $WF_6$ gas and $WCl_4$ gas. The flow rate of Si/W gas may be less than 5 vol % of the total flow rate of the processing gas.

The processing gas may further contain sulfur-containing gas. The sulfur-containing gas may include at least one selected from the group consisting of COS and $SF_6$.

The processing gas may further include a halogen-containing gas other than the Si/W gas. The other halogen-containing gas may be at least one selected from the group consisting of $CHF_3$ gas, $CF_4$ gas, $NF_3$ gas, $SF_6$ gas, $IF_7$ gas, HF gas, HBr gas, $Cl_2$ gas, $BCl_3$ gas and $Br_2$ gas.

(Step ST3: Plasma Formation)

In step ST3, plasma is formed from the processing gas supplied to the plasma processing space 10*s*.

Figure 4:
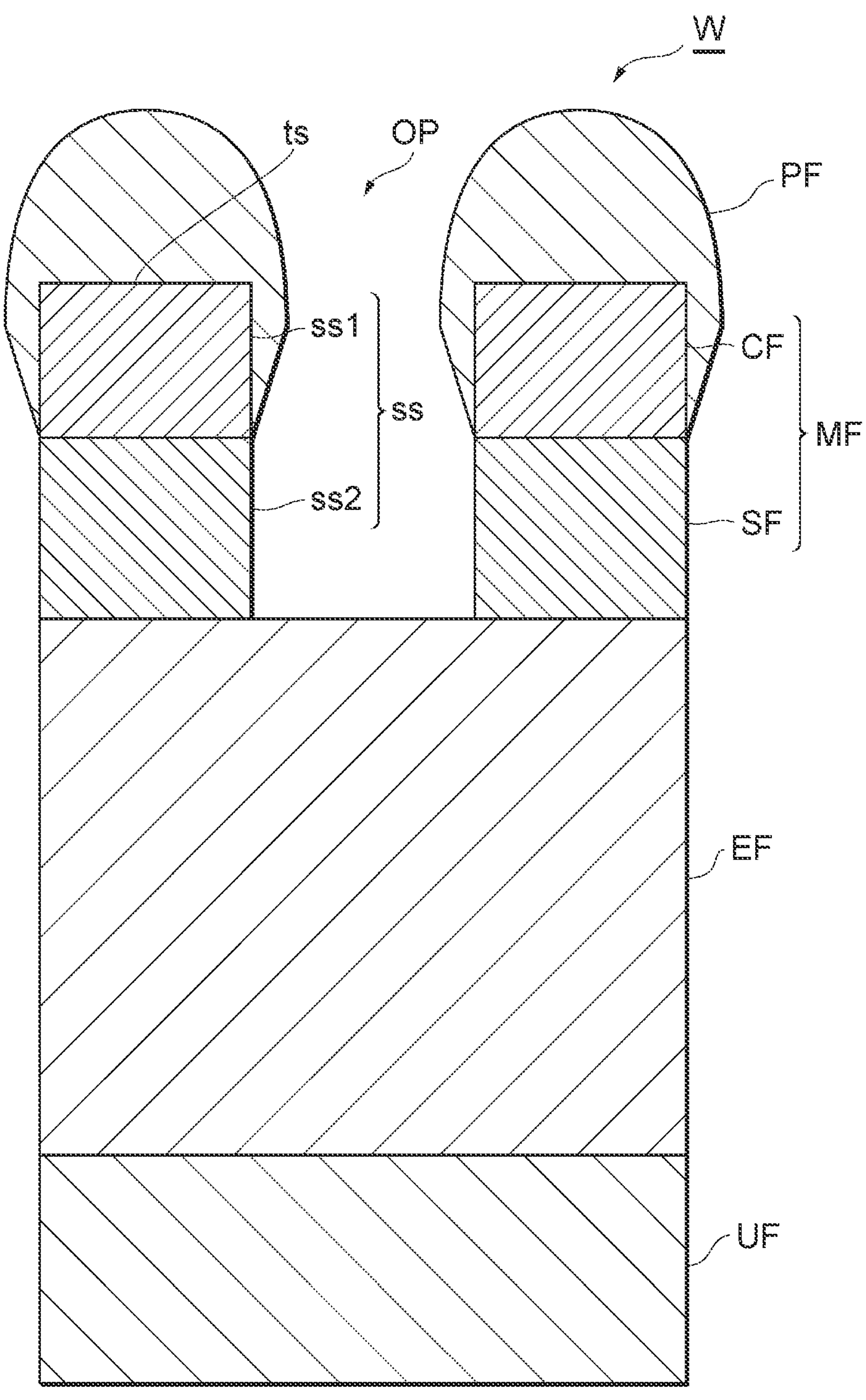
FIG. 4 schematically illustrates an example of the cross-sectional structure of the substrate W immediately after the start of step ST3.

FIG. 4 schematically illustrates an example of the cross-sectional structure of the substrate W immediately after the start of processing in step ST3. In the present processing method, Si or W in the Si/W gas is dissociated in plasma and deposited on the top surface is and side surfaces ss1 of the carbon-containing film CF. This forms a protective film PF on the carbon-containing film CF. As illustrated in FIG. 4, the film thickness of the protective film PF formed on the side surfaces ss1 of the carbon-containing film CF is thinner than the film thickness of the protective film PF formed on the top surface ts. Presumably, this is because Si or W in the plasma anisotropically deposits on the carbon-containing film CF. Experiments by the present inventors showed that such anisotropic deposition was not observed when the mask MF included only a silicon-containing film SF. In this case, Si or W in the plasma was isotropically deposited on the silicon-containing film SF, and a protective film was formed on the side surfaces of the silicon-containing film SF to the same extent as on the top surface.

The protective film PF includes Si or W or oxides of these. The protective film PF has lower reactivity with active species of oxygen in plasma than the carbon-containing film CF has. During the step ST3, the protective film suppresses etching of the carbon-containing film CF by active species of oxygen in the plasma. The protective film PF may also be formed on the side surfaces ss2 of the silicon-containing film. That is, the protective film may be formed over the entire side surfaces ss of the mask MF.

Figure 5:
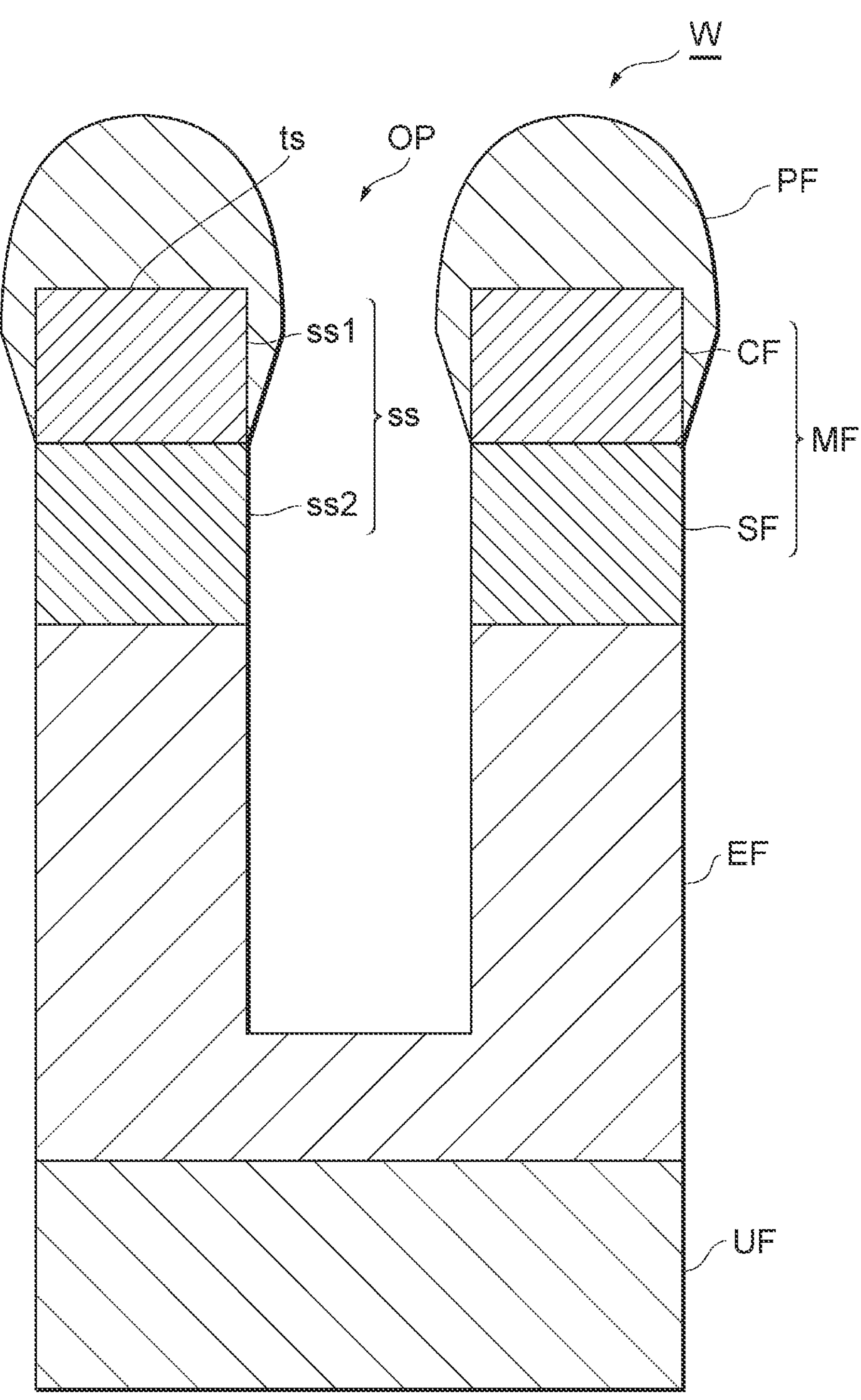
FIG. 5 schematically illustrates an example of the cross-sectional structure of the substrate W during step ST3.

FIG. 5 schematically illustrates an example of the cross-sectional structure of the substrate W during the processing in step ST3. During step ST3, active species of oxygen and others in the plasma are attracted to the substrate W, thus etching the etching target film EF. That is, a portion of the etching target film EF corresponding to the opening OP of the mask MF is etched in the depth direction (direction from top to bottom in the drawing) to form a recess. During step ST3, the protective film PF can be somewhat removed by collisions of ions and others in the plasma. However, the deposition of Si or W also continues simultaneously, meaning that the protective film PF will not be completely removed during step ST3. Note that the flow rate of the Si/W gas may or may not be constant during step ST3. For instance, the flow rate of the Si/W gas may be reduced after a certain period of time has passed since the start of step ST3. The flow rate of the Si/W gas needs to be sufficient to form the protective film PF immediately after the start of the step ST3, but after a certain period of time has passed, a flow rate that can compensate for the decrease in the protective film PF suffices.

According to the present processing method, the protective film PF is formed on the carbon-containing film CF immediately after the start of step ST3. As described above, during the step ST3, the protective film PF suppresses etching of the carbon-containing film CF by active species of oxygen in the plasma. The carbon-containing film CF left unremoved during step ST3 means that the underlying silicon-containing film SF naturally remains. In other words, the present processing method dramatically improves the selection ratio relative to the mask MF.

As described above, the film thickness of the protective film PF formed on the side surfaces ss1 of the carbon-containing film CF is thinner than the film thickness of the protective film PF formed on the top surface ts. This prevents the protective film PF from depositing on the side surfaces ss1 of the carbon-containing film CF and thus the width of the opening OP from getting narrower. This accordingly suppresses shape abnormalities (bowing and tapering) of the recess formed in the etching target film EF.

Figure 6:
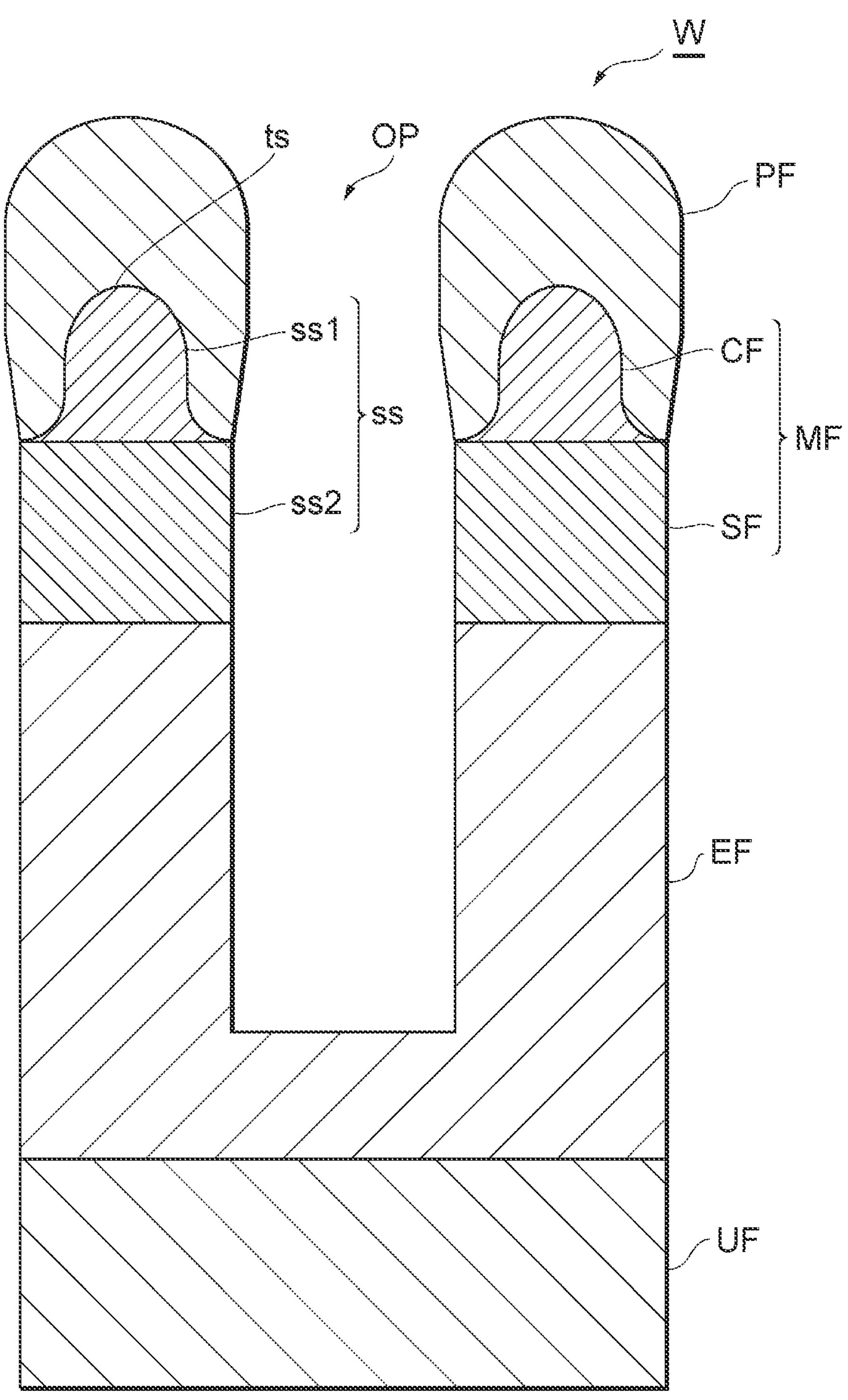
FIG. 6 schematically illustrates another example of the cross-sectional structure of the substrate W during step ST3.

FIG. 6 schematically illustrates another example of the cross-sectional structure of the substrate W during the processing in step ST3. As illustrated in FIG. 6, the carbon-containing film CF can gradually shrink inward in the width direction (horizontal direction in the figure) during step ST3. In this case, the protective film PF is formed along the carbon-containing film CF that has shrunk in the width direction, thus further suppressing overhanging of the protective film PF in the width direction. This accordingly suppresses narrowing of the opening OP in width, thus suppressing shape abnormalities of the recess formed in the etching target film EF.

EXAMPLES

The following describes examples of the present processing method. This disclosure is in no way limited by the following examples.

Figure 7:
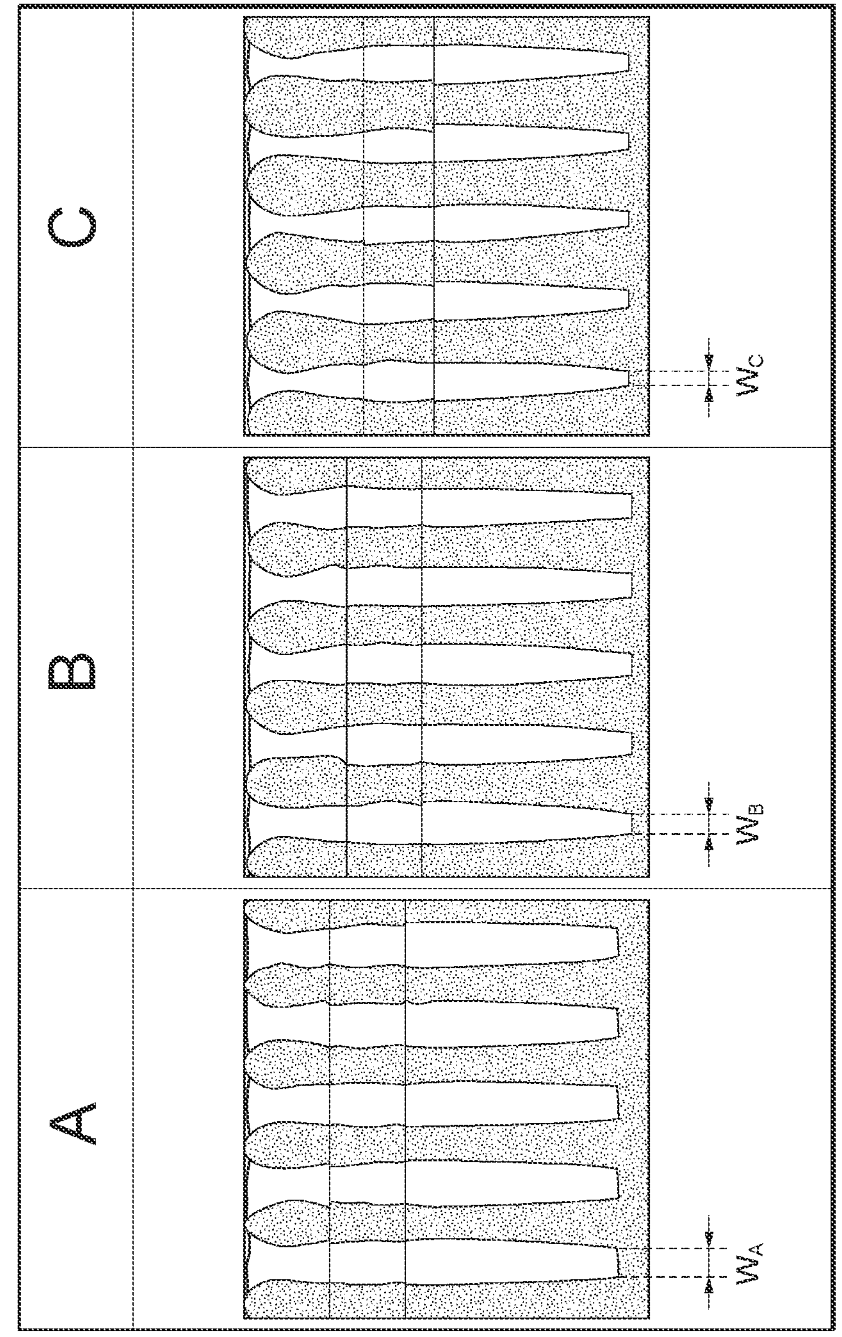
FIG. 7 depicts an example of substrates according to Examples.

FIG. 7 depicts an example of substrates according to Examples 1 to 3. In Examples 1 to 3, the present processing method was applied using the plasma processing apparatus 1 to etch the etching target film EF on the substrate W. Polysilicon was used as the underlying film UF of the substrate W, and ACL film was used as the etching target film EF. The mask MF was formed by two layers of silicon-containing film SF and carbon-containing film CF. SiON film was used as the silicon-containing film SF and BARC film as the carbon-containing film CF. Examples 1 to 3 used $O_2$ gas, $SiCl_4$ gas and $Cl_2$ gas as processing gases. In Examples 1 to 3, the flow rate ratio of $SiCl_4$ gas to the total flow rate of processing gas was 4 vol %, 6 vol %, and 8 vol %, respectively.

In FIG. 7, A to C are diagrams depicting cross-sectional structures of the etching target films EF after etching according to Examples 1 to 3, respectively. As illustrated in FIG. 7, the lower the flow rate ratio of $SiCl_4$ gas to the total flow rate of processing gas, the less tapered the recess formed in the etching target film EF by etching and the wider the bottom of the recess ($W_A>W_B>W_C$). That is, the verticality of recesses formed by etching was enhanced. Presumably, this is because a less flow rate of the $SiCl_4$ gas that contributes to the formation of the protective film PF reduces the deposition amount of the protective film PF on the side surfaces ss of the mask MF, and thus further suppresses the blockage of the mask MF.

Another Example of the Processing Method

Various modifications may be made to the present processing method without departing from the scope and spirit of this disclosure.

Figure 8:
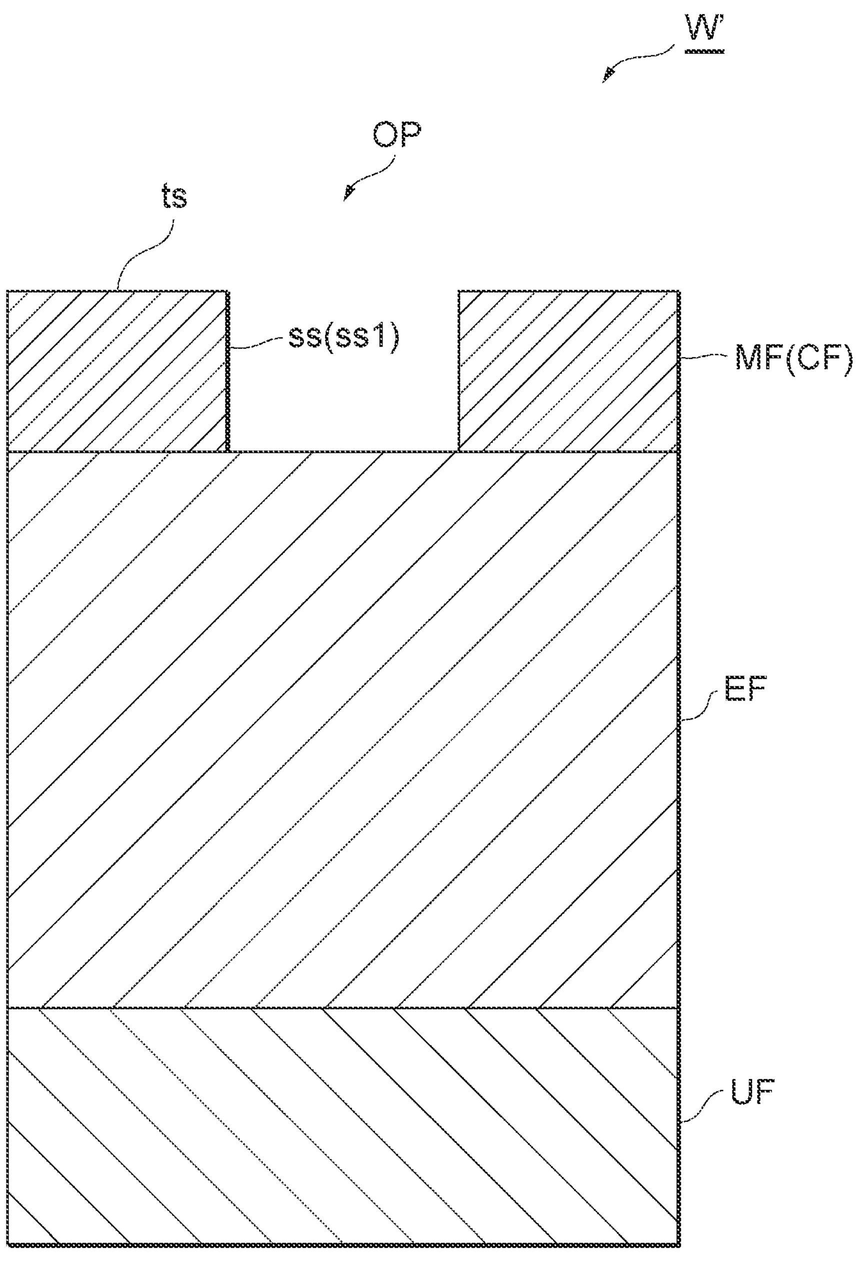
FIG. 8 schematically illustrates an example of the cross-sectional structure of a substrate W' according to a modified example.

FIG. 8 schematically illustrates an example of the cross-sectional structure of a substrate W' according to a modified example. The substrate W' differs from the substrate W in FIG. 3 in that the mask MF includes a single layer of carbon-containing film CF. In this example of this substrate W' also, the protective film PF is formed on the carbon-containing film CF immediately after the start of process ST3, so that the carbon-containing film CF can fully function as the mask during step ST3.

For instance, the step of widening the opening width of the opening OP (de-clogging) may be performed one or more times during step ST3. Specifically, processing gas containing $H_2$ gas and $NF_3$ gas, for example, may be supplied into the plasma processing space 10*s* to form a plasma to partially remove the protective film PF formed on the side surfaces ss1 of the carbon-containing film CF. This suppresses overhanging of the protective film PF in the width direction, that is, narrowing of the opening OP in width, during step ST3. This accordingly suppresses shape abnormalities of the recess formed in the etching target film EF.

For instance, the present processing method may be performed using another plasma processing apparatus including any plasma source, such as capacitively coupled plasma or microwave plasma, other than the inductively coupled plasma processing apparatus 1.

One exemplary embodiment of the present disclosure provides a technique that enhances the selection ratio to the mask.

The above embodiments are just for illustration of the present disclosure, and are not intended to limit the present disclosure to them. Various modifications may be made to the embodiments as described above without departing from the scope and spirit of this disclosure. For instance, some elements in one embodiment can be added to another embodiment. Some elements in one embodiment can be replaced with corresponding elements in another embodiment.

What is claimed is:

1. A plasma processing method performed with a plasma processing apparatus including a chamber, comprising:

(a) providing a substrate in the chamber, the substrate having an organic film and a mask on the organic film, the mask including a silicon-containing film and a carbon-containing film on the silicon-containing film; and (b) forming a plasma from a processing gas in the chamber, the processing gas including an oxygen-containing gas and a gas containing Si or W and a halogen, (b) including:

(b1) forming a protective film on at least the carbon-containing film of the mask; and (b2) etching the organic film through the mask having the protective film formed thereon, wherein the (b1) continues after a start of the (b2), and the protective film formed in the (b1) on an entirety of a side surface of the carbon-containing film is thinner than an entirety of the protective film formed on a top surface of the carbon-containing film.

2. The plasma processing method according to claim 1, wherein the gas containing Si or W and a halogen includes at least $SiCl_4$, and a flow rate of the $SiCl_4$ is 4 vol % or more and less than 5 vol % relative to a total flow rate of the process gas.

3. The plasma processing method according to claim 1, wherein the gas containing Si or W and a halogen includes at least $WF_6$.

4. The plasma processing method according to claim 1, wherein the protective film includes silicon or tungsten.

5. The plasma processing method according to claim 1, wherein the silicon-containing film comprises a SiON film.

6. The plasma processing method according to claim 1, wherein the carbon-containing film comprises a spin on carbon (SOC) film or a bottom anti-reflection coating (BARC) film.

7. The plasma processing method according to claim 1, wherein the oxygen-containing gas includes at least one selected from the group consisting of $O_2$, $O_3$, CO, $CO_2$, and $H_2O$.

8. The plasma processing method according to claim 1, wherein the processing gas includes a sulfur-containing gas.

9. The plasma processing method according to claim 8, wherein the sulfur-containing gas includes COS or $SO_2$.

10. The plasma processing method according to claim 1, wherein the processing gas further includes a halogen-containing gas.

11. The plasma processing method according to claim 1, wherein the (b1) continues immediately after the start of the (b2).

12. A plasma processing method performed with a plasma processing apparatus including a chamber, comprising:

(a) providing a substrate in the chamber, the substrate having an organic film and a mask on the organic film, the mask including a carbon-containing film; and (b) forming a plasma from a processing gas in the chamber, the processing gas including an oxygen-containing gas and a gas containing Si or W and a halogen, (b) including:

(b1) forming a protective film on at least the carbon-containing film of the mask; and (b2) etching the organic film through the mask having the protective film formed thereon, wherein the (b1) continues after a start of the (b2), and the protective film formed in the (b1) on an entirety of a side surface of the carbon-containing film is thinner than the protective film formed on an entirety of a top surface of the carbon-containing film.

* * * * *